United States Patent [19]

Shibayama et al.

[11] 4,019,074

[45] Apr. 19, 1977

[54] LiNbO₃ SAW DEVICE

[75] Inventors: Kimio Shibayama; Kazuhiko Yamanouchi, both of Sendai, Japan

[73] Assignee: Tokyo Shibaura Electric Co., Ltd., Kawasaki, Japan

[22] Filed: Oct. 1, 1975

[21] Appl. No.: 618,339

[30] Foreign Application Priority Data

Oct. 7, 1974 Japan .......................... 49-114689

[52] U.S. Cl. .................................. 310/9.5; 310/9.8
[51] Int. Cl.² ......................................... H01L 41/04
[58] Field of Search ................ 310/8, 9.5, 9.6, 9.7, 310/9.8; 333/30 R; 252/62.9 R

[56] References Cited

UNITED STATES PATENTS 3,423,686  1/1969  Ballman et al. .......... 252/62.9 R X

Primary Examiner—Mark O. Budd
Attorney, Agent, or Firm—Oblon, Fisher, Spivak, McClelland & Maier

[57] ABSTRACT

An electro-mechanical transducer comprises a LiNbO₃-piezoelectric substrate containing as an impurity at least one material selected from the group consisting of Ta, Ta₂O₅, Pd, SiO₂, TiO₂, V₂O₅ and V, and at least two electro-mechanical transducing interdigital electrode pairs, provided on said LiNbO₃-piezoelectric substrate.

4 Claims, 5 Drawing Figures

LiNbO₃ SAW DEVICE

This invention relates to an electro-mechanical transducer using a LiNbO₃-piezoelectric substrate having a good temperature characteristic.

There are two kinds of electro-mechanical transducers, one of which is an elastic surface wave device utilizing surface waves being propagated on the surface of a piezoelectric substrate and the other of which is a bulk wave device utilizing bulk waves being propagated through the interior of a piezoelectric substrate. Any of these two devices is so constructed that surface waves or bulk waves are generated in the piezoelectric substrate by applying electrical signals to a transmitting electrode device provided on the piezoelectric substrate and the surface waves or bulk wave propagated on or in the surface of the piezoelectric substrate are converted by a receiving electrode device into electrical signals.

The piezoelectric substrate used in the present invention desirably satisfies the following conditions.
1. The electro-mechanical coupling coefficient should be practically suitable, or usually several %.
2. The temperature coefficient of the substrate with respect to the speed at which surface waves or bulk waves are propagated or delay time should be small.
3. The substrate should have a small dielectric constant $\epsilon$ and be suitable to high frequency-electro-mechanical transducer.
4. The propagation loss of surface waves or bulk waves should be small.
5. The substrate should be inexpensive.
6. Fabrication of the substrate should be easy.

LiNbO₃ is presently known as a piezoelectric material almost meeting the above-enumerated conditions. But the temperature coefficient of the LiNbO₃ as mentioned in the above item (2) is considerably large and therefore this LiNbO₃ has the drawback that the extent to which it is put to practical use is limited.

The object of the invention is to provide an electro-mechanical transducer using a LiNbO₃-piezoelectric substrate having a good temperature characteristic.

According to the invention, an electro-mechanical transducer is obtained which comprises a LiNbO₃-piezoelectric substrate containing as an impurity at least one selected from the group consisting of Ta, Ta₂O₅, Pd, SiO₂, TiO₂, V₂O₅, V and a mixture of at least two of these impurities, and at least one electro-mechanical transducing electrode device provided on said LiNbO₃-piezoelectric substrate.

This invention can be more fully understood from the following detailed description when taken in conjunction with the accompanying drawings in which.

Figure 1:
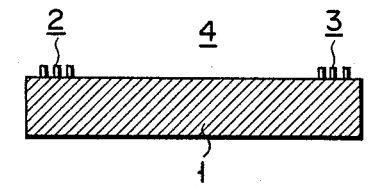
FIG. 1 is a longitudinal sectional view of an elastic surface wave device according to an embodiment of the invention.
Figure 2:
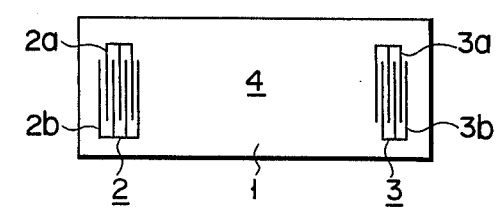
FIG. 2 is a plan view of the device of FIG. 1.
Figure 3:
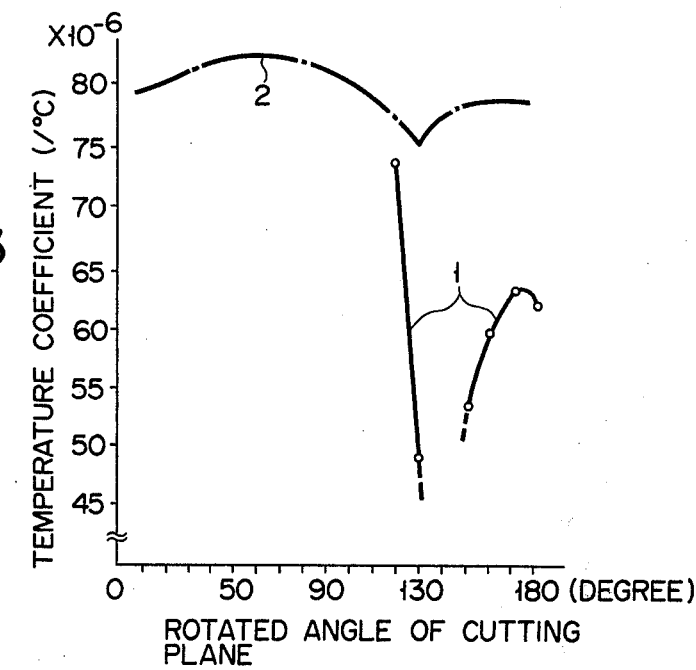
Figure 4:
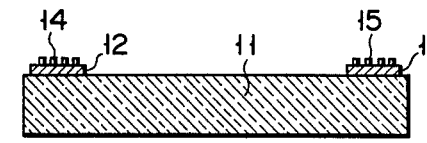
Figure 5:
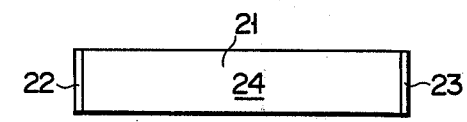

FIG. 3 graphically shows the relation between the rotational angle of a cutting plane of the device shown in FIGS. 1 and 2 and the temperature coefficient of this device with respect to delay time;

FIG. 4 is a longitudinal sectional view of an elastic surface wave device according to another embodiment of the invention; and FIG. 5 is a side view of an elastic surface wave device according to still another embodiment of the invention.

Referring to FIGS. 1 and 2, a piezoelectric substrate 1 is formed of LiNbO₃ and contains a metal oxide of Ta₂O₅ as an impurity. At both longitudinal ends of the upper surface of the piezoelectric substrate 1 are provided a transmitting electrode device 2 and a receiving electrode device 3, respectively. The transmitting and receiving electrode devices 2 and 3 are composed respectively of pairs of electro-mechanical transducing interdigital electrodes 2a, 2b and 3a, 3b. Thus, an elastic surface wave device 4 is constructed.

Hereinafter, the method of manufacturing the piezoelectric substrate 1 is explained. First, a Li₂CO₃ powder, a Nb₂O₅ powder and a Ta₂O₅ powder are mixed and dissolved in a crucible made of, for example, platinum. The Li₂CO₃ powder and Nb₂O₅ powder respectively have such components as shown in Table 1, and a mixed ratio thereof may be, for example, the ratio used upon manufacture of an ordinary LiNbO₃. The Ta₂O₅ powder is added as an impurity and the adding amount thereof is approximately 26,000 PPM (Parts per Million) as expressed in molar ratio.

A LiNbO₃ monocrystal containing Ta₂O₅ as an impurity in the form of a compound is grown from a melt in the platinum crucible, for example, by using a resistance heat-utilizing, draw-up method. In the growth of this LiNbO₃ monocrystal, any other heating method than the resistance heat method, for example, a high frequency-heating method may be used. Further, the proportion of the LiNbO₃ containing no Ta₂O₅ as an impurity is as shown in Table 1. The LiNbO₃ monocrystal-growing operation using said resistance heat method was carried out under the following conditions.

| Temperature gradient right below the melt surface | 50° to 80° C/cm |
|---|---|
| Draw-up speed of a seed monocrystal | 5 to 8 mm/Hr |
| Rotational speed of the seed monocrystal | 50 to 60 RPM |

In this case, by drawing up the seed monocrystal toward, for example, the X axis (crystalline axis) a good LiNbO₃ monocrystal was obtained which did not have a protrusion being usually formed on the outer peripheral surface of a grown monocrystal, or a so-called ridge.

The LiNbO₃ monocrystal thus obtained is polarized by a prior art method. This polarizing treatment may be carried out in the course of growing the LiNbO₃ monocrystal concurrently with this growth. The LiNbO₃ monocrystal thus polarized is cut at an appropriate orientation, and is subjected to, for example, a rotated Y-131° cut. This is a method of cutting a crystalline body in a direction intersecting an axis taken by rotating the Y axis about the X axis through an angle of 131° (rotated Y - 131° axis), at right angles thereto. After the surface of a LiNbO₃ substrate 1 obtained by said cutting is abraded, the transmitting and receiving electrode devices 2, 3 are attached to said LiNbO₃ substrate 1 as shown in FIG. 1.

FIG. 3 graphically shows the temperature coefficient of a rotated Y-cut substrate with respect to the delay time for a signal having a frequency of 18 MHz to 20 MHz, said rotary Y-cut substrate being prepared by cutting a LiNbO₃ monocrystalline body containing Ta₂O₅ in a direction intersecting an axis taken by rotating the Y axis through various angles, at right angles thereto. In FIG. 3, a curve 1 represents the present substrate and a curve 2 a prior art LiNbO₃ substrate containing no impurity. In the prior art, in cases where the rotational angle of a cutting plane is varied from 0° to 180°, the resulting substrate has a minimum temperature coefficient of 75 × 10⁻⁶/C° (75 PPM/C°) at a point where said angle is 131°, whereas in the present invention the substrate similarly obtained has a minimum temperature coefficient of 49.1 PPM/°C at the same point. It is seen from this tt the present substrate is greatly improved in respect of its temperature characteristic.

Further, a Li₂O₃ powder and a Nb₂O₅ powder were mixed and an impurity presenting a positive temperature coefficient while being in a metallic condition, for example, a palladium (Pd) powder, was added by the amount of 2000 PPM as expressed in molar ratio. The resulting mass was similarly dissolved and heated and drawn up to obtain a LiNbO₃ monocrystal containing palladium as an impurity. When measurement was made of the temperature coefficient of a substrate obtained from this monocrystal as in the case of FIG. 3, this substrate had an improved-temperature characteristic value of 6% PPM/°C.

Further, a Li₂CO₃ powder and a Nb₂O₅ powder were dissolved in a platinum crucible with 4500 PPM (molar ratio) of silicon presenting a positive temperature coefficient while being in a metallic condition added in the form of a SiO₂, and from this mass a LiNbO₃ monocrystal containing SiO₂ was grown by using a resistance heat-utilizing, draw-up method. When measurement was made of the temperature coefficient of a substrate prepared from this monocrystal, this substrate had an improved-temperature characteristic value of 62.6 PPM/°C.

The temperature coefficient of the above-mentioned respective substrates with respect to the delay time was measured by measuring the variation of the delay time with temperature variation through causing the direct wave to interfere in the elastic surface wave and measuring the frequency at which the interference wave becomes minimum.

The foregoing description referred to the case where Ta₂O₅, palladium and SiO₂ were used as an impurity, but TiO₂, V₂O₅ or vanadium (V) may also be used as an impurity and even when at least two of these impurities are used in a mixed form, a similar effect can be obtained.

FIG. 4 shows an embodiment of the invention wherein LiNbO₃ substrates 12, 13 containing, for example, Ta₂O₅ as an impurity are secured onto a glass substrate 11 and interdigital electrode pairs 14, 15 are provided on the substrates 12, 13, respectively. In this case, the surface wave produced from a transmitting transducer composed of the LiNbO₃ substrate 12 and the interdigital electrode pair 14 is propagated through the surface of the glass substrate 11 and is received by a receiving transducer composed of the substrate 13 and the interdigital electrode pair 15 and is reproduced into an electrical signal. Also in cases where the elastic surface wave device is constructed as described above, it had a good temperature characteristic.

In the foregoing description, this invention was explained by using an elastic surface wave device, but even when this invention is applied to a bulk wave device, a good temperature characteristic is obtained. FIG. 5 shows an example of the bulk wave device. In FIG. 5, at both longitudinal ends of a LiNbO₃ substrate 21 containing, for example, Ta₂O₅ as an impurity electrodes 22, 23 are provided opposite to each other to form a bulk wave device 24. This bulk wave device 24 generates a bulk wave whose vibration number corresponds to the frequency of an electrical signal applied between the electrodes 22, 23. If, for example, a pair of bulk wave devices each having the foregoing construction are provided, respectively, for both side faces of a piezoelectric substrate, a delay device for electrical signals having bulk waves interposed therebetween will be obtained. Also with respect to the bulk wave device having the construction shown in FIG. 5, a good temperature characteristic was obtained.

What we claim is:

1. An electro-mechanical transducer comprising a LiNbO₃-piezoelectric substrate containing at least one impurity selected from the group consisting of Ta, Ta₂O₅, Pd, SiO₂, TiO₂, V₂O₅, V and a mixture of at least two of these impurities, and at least one electrode device for electro-mechanical conversion, provided on said LiNbO₃-piezoelectric substrate.

2. An electro-mechanical transducer according to claim 1 characterized in that said electro-mechanical transducer is an elastic surface wave device which comprises a LiNbO₃-piezoelectric substrate prepared by performing a rotated Y-131° cut, and first and second interdigital electrode pairs provided on said piezoelectric substrate separately from each other.

3. An electro-mechanical transducer according to claim 1 characterized in that said electro-mechanical transducer is an elastic surface wave device which comprises a glass substrate, first and second LiNbO₃-piezoelectric substrates prepared by performing a rotated Y-131° cut, provided on said insulation substrate separately from each other, and interdigital electrode pairs provided on each of said piezoelectric substrates.

4. An electro-mechanical transducer according to claim 1 characterized in that said electro-mechanical transducer is a bulk wave device which comprises first and second electrodes provided on said LiNbO₃-piezoelectric substrate.

* * * * *